(12) United States Patent
Ito et al.

(10) Patent No.: US 7,199,590 B2
(45) Date of Patent: Apr. 3, 2007

(54) SCREENING METHOD FOR LAMINATED CERAMIC CAPACITORS

(75) Inventors: Kazunori Ito, Tokyo (JP); Yuusaku Horie, Tokyo (JP); Kazuyuki Hasebe, Tokyo (JP)

(73) Assignee: TDK Corporation, Tokyo (JP)

( * ) Notice: Subject to any disclaimer, the term of this patent is extended or adjusted under 35 U.S.C. 154(b) by 17 days.

(21) Appl. No.: 10/946,077

(22) Filed: Sep. 22, 2004

(65) Prior Publication Data

US 2005/0068711 A1    Mar. 31, 2005

(30) Foreign Application Priority Data

Sep. 25, 2003   (JP) .............................. 2003-334140

(51) Int. Cl.
  *G01R 31/12*  (2006.01)
  *G01R 31/00*  (2006.01)
  *B07C 5/344*  (2006.01)

(52) U.S. Cl. ...................... 324/548; 324/501; 209/574

(58) Field of Classification Search ................ 324/548, 324/551
See application file for complete search history.

(56) References Cited

U.S. PATENT DOCUMENTS

| | | | | |
|---|---|---|---|---|
| 5,510,719 | A * | 4/1996 | Yamamoto | ................... 324/548 |
| 6,469,516 | B2 * | 10/2002 | Nishioka et al. | ............ 324/548 |
| 6,469,517 | B1 * | 10/2002 | Kawaguchi et al. | ........ 324/548 |
| 6,476,617 | B1 * | 11/2002 | Kawaguchi et al. | ........ 324/548 |
| 6,642,721 | B2 * | 11/2003 | Tsuchiya | ..................... 324/548 |
| 6,812,692 | B2 * | 11/2004 | Sakai | ....................... 324/158.1 |

FOREIGN PATENT DOCUMENTS

| | | |
|---|---|---|
| JP | 9-205037 | 8/1997 |
| JP | 2000-208380 | * 1/1999 |
| JP | 2000-150328 | 5/2000 |
| JP | 2000-164471 | 6/2000 |
| JP | 2000-260653 | 9/2000 |

* cited by examiner

*Primary Examiner*—Anjan Deb
*Assistant Examiner*—Jeff Natalini
(74) *Attorney, Agent, or Firm*—Oblon, Spivak, McClelland, Maier & Neustadt, P.C.

(57) ABSTRACT

A laminated ceramic capacitor C has a plurality of internal electrodes embedded in a dielectric base substance in a stratified manner, the internal electrodes are caused to conduct to a pair of terminal electrodes provided on an outer surface of the dielectric base substance, and the terminal electrode has an outermost layer containing Sn as a main component. There is provided a step of setting the laminated ceramic capacitor in a temperature environment which is not less than 125° C. and not more than 180° C. and applying a direct-current voltage between the terminal electrodes in order to measure a direct-current insulation resistance. The step of applying the direct-current voltage includes a first step and a second step. A direct-current voltage V1 (V/μm) which falls within a range of 20 to 40 (V/μm) is applied at the first step, and a direct-current voltage V2 (V) with a rated voltage being taken into consideration is applied at the second step after termination of the first step.

5 Claims, 2 Drawing Sheets

SCREENING METHOD FOR LAMINATED CERAMIC CAPACITORS

BACKGROUND OF THE INVENTION (i) Field of the Invention

The present invention relates to a screening method for selectively eliminating a laminated ceramic capacitor having a defect in an initial internal structure or a defect which may possibly reduce duration of life during a period of service.

(ii) Description of the Related Art

With a reduction in size and weight and an increase in performance of electronic devices, a reduction in size and an increase in capacity of laminated ceramic capacitors have also considerably advanced, a dielectric material layer thickness per layer has become very small, and a slight structural defect in the laminated dielectric material has become a factor which deteriorates the reliability of the laminated ceramic capacitor.

Thus, in the laminated ceramic capacitor, in order to selectively eliminate a product having an internal structural defect or a product which may possibly shorten a duration of line during a period of service, there is carried out a screening method by which a direct-current voltage which is several-fold or several-ten-fold of a rated voltage, e.g., a voltage which is not less than DC 300 V is applied, and a direct-current insulation resistance (which will be referred to as an IR hereinafter) is measured.

When executing screening, characteristics and an electrode structure of a dielectric material constituting a laminated ceramic capacitor must be taken into consideration, and the material characteristics and the electrode structure must be prevented from being adversely affected by screening. Further, considering that a product which may possibly shorten duration of life during a period of service must be selectively eliminated in advance, bearing a reliability evaluation is also required.

First, giving a consideration on a dielectric material with respect to the above-described condition which must be satisfied in screening, this type of dielectric material involves electrostriction. If a direct-current voltage which is not less than 300 V is applied between terminal electrodes of a multiplayer ceramic capacitor, the electrostriction may be capable of generating a crack or the like even in a high-quality product which does not have an internal structural defect. The crack can be a factor which provokes a sudden deterioration in the IR in a mounted state.

Setting an application voltage to a voltage level at which an electrostriction crack or the like is not generated can avoid the above-described problem. However, this result in insufficient screening for selecting a high-quality laminated ceramic capacitor.

A patent reference 1 (Japanese Patent Application Laid-open No. 1997-205037) discloses a technique which measures an IR in a state that a laminated ceramic capacitor is heated and a product having an abnormal measured resistance is selectively eliminated as a characteristic defective in place of just applying a direct-current voltage which is not less than a rated voltage to a laminated ceramic capacitor. However, although the patent reference 1 proposes that heating is effected under a temperature condition of 50 to 150° C., an embodiment only discloses a heating condition of 85° C. Under this temperature condition, occurrence of a crack involved by the electrostriction cannot be prevented.

A patent reference 2 (Japanese Patent Application Laid-open No. 2000-150328) discloses a screening method which applies a direct-current voltage which is not less than 300 V is applied as a withstand voltage test and measures an IR in a state that a laminated ceramic capacitor is heated at a temperature which is at least 150° C. or above as means for solving the problem in the patent reference 1.

However, although there is a description that an upper limit of the heating temperature is 200° C., this upper limit value is selected based on a relationship with a measuring instrument or the like. This patent reference 2 does not disclose a temperature condition which should be satisfied when an electrode structure of the laminated ceramic capacitor is taken into consideration.

Moreover, the patent reference 2 just discloses the screening method about a relaxa-based laminated ceramic capacitor, and it does not disclose a screening condition which should be satisfied about a laminated ceramic capacitor having other characteristics, e.g., a laminated ceramic capacitor having B characteristic, F characteristics or X7R characteristics. Additionally, it does not mention about a reliability evaluation.

A patent reference 3 (Japanese Patent Application Laid-open No. 2000-260653) describes a point that a capacitor is heated to a temperature which is not less than a Curie temperature of a dielectric material layer and not less than 125° C., and an IR and an IR life are estimated and judged based on a phase angle of an impedance and a relationship between a frequency and the phase angle. This patent reference does not discloses a technique which directly measures an IR.

SUMMARY OF THE INVENTION

It is an object of the present invention to provide a method which can screen a laminated ceramic capacitor without generating an electrostriction crack or the like.

It is another object of the present invention to provide a method which can screen a laminated ceramic capacitor without damaging terminal electrodes.

It is still another object of the present invention to provide a screening method which can guarantee the reliability during a period of service of a laminated ceramic capacitor.

To achieve this aim, the present invention is intended for a method of screening a laminated ceramic capacitor.

The laminated ceramic capacitor has a plurality of internal electrodes embedded in a dielectric base substance in a stratified manner, the internal electrodes are caused to conduct to a pair of terminal electrodes provided on an outer surface of the dielectric base substance, and the terminal electrode has an outermost layer containing Sn as a main component.

In screening, the laminated ceramic capacitor is set in a temperature environment which is not less than 125° C. and not more than 180° C., a direct-current voltage is applied between the terminal electrodes, and a direct-current insulation resistance is measured.

The step of applying a direct-current voltage includes a first step and a second step. A direct-current voltage V1 (V/μm) which falls within a range of 20 to 40 (V/μm) is applied at the first step, and a direct-current voltage V2 (V) with a rated voltage being taken into consideration is applied at the second step after termination of the first step.

A dielectric material used in the laminated ceramic capacitor demonstrates ferroelectric characteristics in a temperature range lower than a Curie point, and involves electrostriction when a voltage is applied thereto. Therefore, if a high direct-current voltage is applied between terminal electrodes of the laminated ceramic capacitor, the electrostriction generates a crack or the like even in a high-quality product having no internal structural defect. Since the laminated ceramic capacitor has a plurality of internal electrodes embedded in the dielectric base substance in the stratified manner, the electrostriction occurs between the respective dielectric layers between the internal electrodes, and a crack is produced in the dielectric layers.

On the other hand, the dielectric material used in the laminated ceramic capacitor demonstrates paraelectric characteristics in a temperature range higher than the Curie point, and the electrostriction rarely occurs even if a high direct-current voltage is applied.

The screening method according to the present invention sets a laminated ceramic capacitor in a temperature environment higher than a Curie point of a dielectric material constituting the dielectric base substance, applies a direct-current voltage between terminal electrodes and measures an IR while paying attention to the above-described characteristics of the dielectric material. As described above, the dielectric base substance becomes a paraelectric material under a temperature condition higher than the Curie point, and the electrostriction rarely occurs. For example, a Curie point of a dielectric material which is usually used in a laminated ceramic capacitor having X7R characteristics is approximately 120° C. The electrostriction becomes maximum at the Curie point, and suddenly lowers at a temperature above the Curie point. Thus, in the present invention, a lower limit value of the temperature condition is set to a value which is higher than the Curie point by 5° C. Therefore, according to the present invention, a crack due to the electrostriction can be prevented from being generated between the respective dielectric layers between the internal electrodes by screening.

The internal electrodes are caused to conduct to a pair of terminal electrodes provided on an outer surface of the dielectric base substance, and the terminal electrodes are used for soldering on a circuit board or the like. Since the terminal electrode has an outermost layer containing Sn as a main component, the laminated ceramic capacitor can be assuredly soldered on a circuit board or the like by utilizing Sn constituting the outermost layer.

In the present invention, a function and a structure of the terminal electrode are taken into consideration, and an upper limit value of the temperature condition is set to a value which is not more than 180° C. When the upper limit value of the temperature condition is set to 180° C., oxidation of Sn constituting the outermost layer of the terminal electrode can be avoided, thereby assuredly soldering at the time of mounting.

The step of applying a direct-current voltage includes a first step and a second step. At the first step, a direct-current voltage which falls within a range of 20 to 40 (V/μm) is applied. If the voltage falls within this voltage range, a product which does not have an internal structural defect or a defect which may possibly shorten a life duration in a period of service is not damaged. On the other hand, as to a product which has a defect in an internal structure or a product which may possibly reduce a life during a period of service, a defect is elicited, and the product can be screened as a defective based on a reduction in IR caused due to elicitation of the defect.

Since sufficient screening is not carried out when a direct-current voltage V1 (V/μm) applied at the first step is less than 20 (V/μm), a crack or a defective is generated in a thermal evaluation and a reliability evaluation or the like. When the direct-current voltage V1 (V/μm) applied at the first step exceeds 40 (V/μm), the voltage becomes an excessive voltage, and a damage such as an internal crack remains in a product. Therefore, a crack or a defective is likewise generated in the thermal evaluation and the reliability evaluation.

Furthermore, since a direct-current voltage V2 (V) with a rated voltage being taken into consideration is applied at the second step after the first step, the terminal evaluation or the reliability evaluation can be made at this second step. Therefore, a product which may possibly reduce a duration of life in a period of service can be selectively eliminated in advance, and the reliability can be guaranteed.

The second step must be executed after the first step. If the second step is performed before the first step, screening becomes insufficient, and a crack or a defective is generated in the thermal evaluation and the reliability evaluation.

It is preferable for a thickness of a dielectric layer between adjacent internal electrodes (interlayer thickness) to be not more than 10 μm. A laminated ceramic capacitor with a small size and a large capacity can be obtained by making the dielectric layer thickness per layer very small in this way.

As described above, according to the present invention, the following effects can be obtained.

(a) A method capable of screening a laminated ceramic capacitor without generating an electrostriction crack or the like can be provided.

(b) A method capable of screening a laminated ceramic capacitor without damaging terminal electrodes can be provided.

(c) A screening method for laminated ceramic capacitors capable of guaranteeing the reliability during a period of service can be provided.

Other objects, structures and advantages of the present invention will be further concretely described with reference to the embodiments.

DESCRIPTION OF THE PREFERRED EMBODIMENTS

Figure 1:
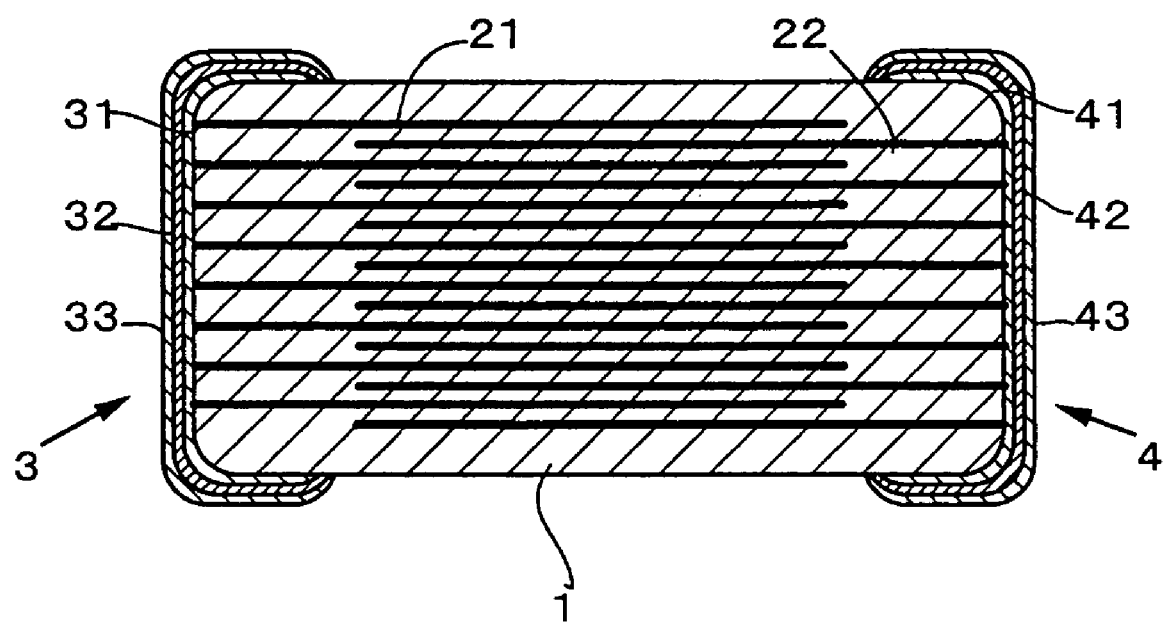
FIG. 1 is a cross-sectional view showing an example of a laminated ceramic capacitor to which a screening method according to the present invention is applied.

FIG. 1 is a cross-sectional view showing an example of a laminated ceramic capacitor to which a screening method according to the present invention is applied. The illustrated laminated ceramic capacitor has a plurality of internal electrodes 21 and 22 embedded in a dielectric base substance 1 in a stratified manner. Two adjacent to internal electrodes 21 and 22 are opposed to each other through, e.g., a dielectric layer whose thickness is not more than 10 μm. The internal electrodes 21 and 22 are formed of, e.g., Ni or Cu. The number of layers of the internal electrodes 21 and 22 varies depending on a demanded electrostatic capacity, and several-ten layers to several-hundred layers are provided.

The internal electrode 21 is caused to conduct to a terminal electrode 3 of a pair of terminal electrodes 3 and 4 provided on an outer surface of the dielectric base substance 1, and the internal electrode 22 is caused to conduct to the terminal electrode 4. The terminal electrodes 3 and 4 have outermost layers 33 and 43 each including Ni as a main component. Intermediate layers 32 and 42 each containing Ni as a main component are provided on inner sides of the outermost layers 33 and 43, and lowermost layers 31 and 41 each containing Cu as a main component are provided on lower sides of the intermediate layers 32 and 42. The lowermost layers 31 and 41 each having Cu as a main component are parts which are directly in contact with the internal electrodes 21 and 22, and the outermost layers 33 and 43 each containing Sn as a main component are layers which are provided in order to assure the solderability at the time of mounting. The intermediate layers 32 and 42 each containing Ni as a main component assume the role of protecting the lowermost layers 31 and 41 each containing Cu as a main component against a solder-eating phenomenon.

Figure 2:
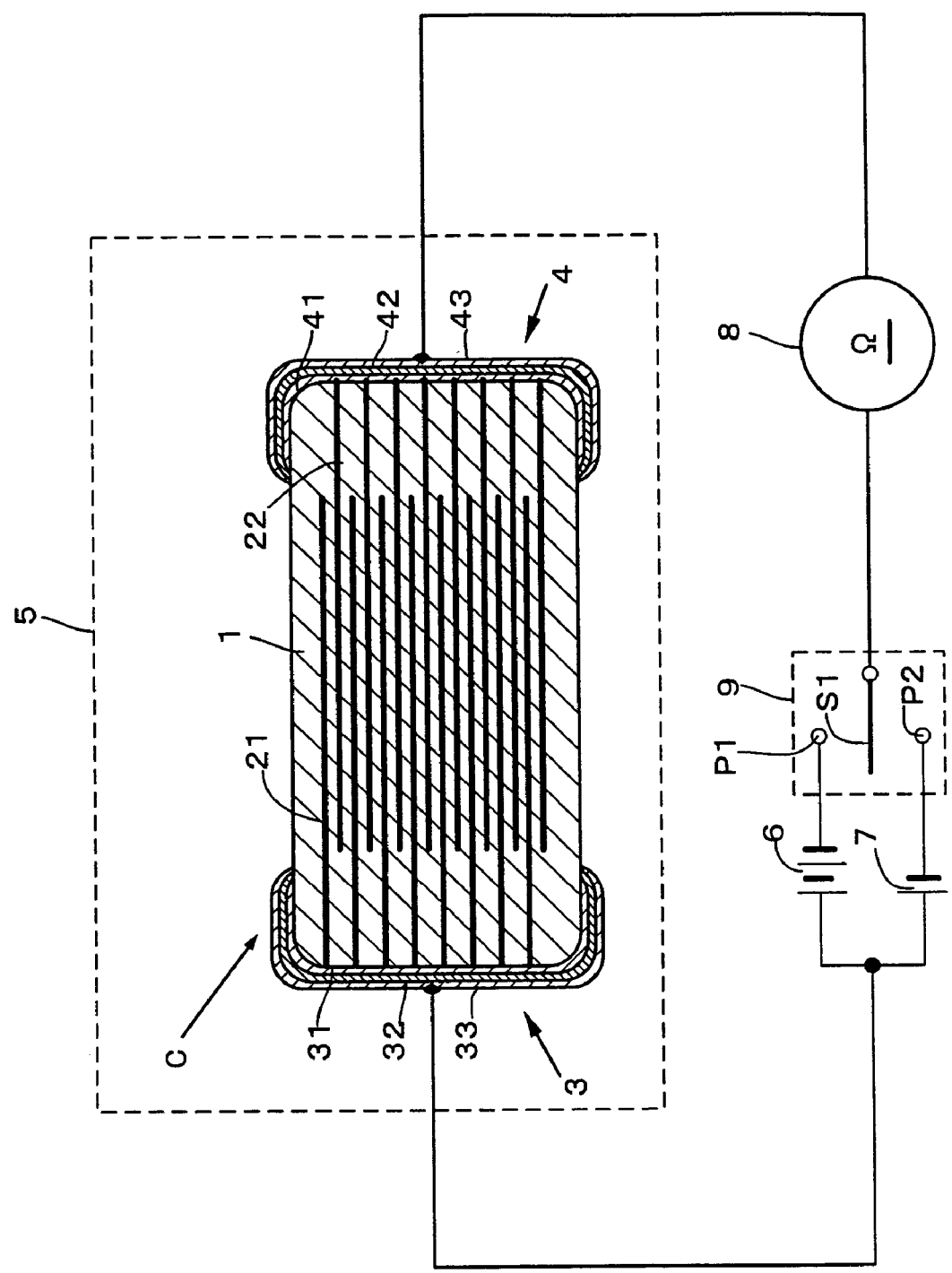
FIG. 2 is a view schematically showing the screening method according to the present invention.

FIG. 2 is a view schematically showing the screening method according to the present invention. In screening, the laminated ceramic capacitor C shown in FIG. 1 is heated by, e.g., heating means 5, and set in a temperature environment which is not less than 125° C. and not more than 180° C. As the heating means 5, for example, a thermostatic oven or a hot plate can be used. Then, in a state that the laminated ceramic capacitor C is set in the temperature environment which is not less than 125° C. and not more than 180° C., a direct-current voltage is applied between the terminal electrodes 3 and 4 from direct-current power supplies 6 and 7, and an IR is measured by a measuring instrument 8.

The step of applying the direct-current voltage includes a first step and a second step. At the first step, a direct-current voltage V1 (V/μm) which falls within a range of 20 to 40 (V/μm) is applied. Then, at the second step, a direct-current voltage V2 (V) taking a rated voltage into consideration is applied after the first step. It is preferable for the direct-current voltage V2 (V) to be approximately threefold to fivefold of the rated voltage. That is because the reliability evaluation at the second step becomes insufficient if the direct-current voltage V2 (V) is less than threefold of the rated voltage, and this voltage becomes an excessive voltage if it exceeds fivefold.

The illustrated embodiment is an example in which the direct-current power supplies 6 and 7 are provided and the first step and the second step are executed by switching the direct-current power supplies 6 and 7 by using a switching circuit 9. At the first step, a movable contact piece S1 of the switching circuit 9 is brought into contact with a contact point P1, and the direct-current voltage V1 of the direct-current power supply 6 is applied between the terminals 3 and 4. An application time can be set within a range of, e.g., 10 msec to 1.0 sec.

At the second step, the movable contact piece S1 of the switching circuit 9 is brought into contact with a contact point P2 after termination of the first step, and the direct-current voltage V2 of the direct-current power supply 7 is applied between the terminals 3 and 4. An application time can be set within a range of, e.g., 10 msec to 1.0 sec.

As described above, the first step includes the step at which the laminated ceramic capacitor C is set in a temperature environment of 125° C. which is higher than a Curie point 120° C. of its dielectric material, the direct-current voltages V1 and V2 are applied between the terminal electrodes 3 and 4, and the IR is measured. As described above, the dielectric base substance 1 becomes a paraelectric material under the temperature condition higher than the Curie point, and the electrostriction is rarely generated. Therefore, according to the present invention, since the electrostriction is rarely produced between the respective dielectric layers between the internal electrodes 21 and 22, a crack due to the electrostriction can be prevented from being generated in the dielectric base substance 1 by screening.

In the laminated ceramic capacitor according to the present invention, since the internal electrodes 21 and 22 are caused to conduct to the pair of terminal electrodes 3 and 4 provided on the outer surface of the dielectric base substance 1 and the terminal electrodes 3 and 4 have the outermost layers 33 and 43 each containing Sn as a main component, the laminated ceramic capacitor C can be assuredly soldered on a circuit board or the like by utilizing Sn constituting the outermost layers 33 and 43.

In the present invention, taking the function and the structure of the terminal electrodes 3 and 4 into consideration, an upper limit value of the temperature condition, is set to 180° C. or a lower value. If the upper limit value of the temperature condition is set to 180° C., oxidation of Sn constituting the outermost layers 33 and 43 of the terminal electrodes 3 and 4 can be avoided, thereby assuredly soldering the laminated ceramic capacitor C at the time of mounting.

The step of applying the direct-current voltage includes a first step and a second step. The direct-current voltage V1 (V/μm) which is applied at the first step is determined as a voltage which falls within a range of 20 to 40 (V/μm). If the voltage falls within this voltage range, a crack or a voltage breakdown is not produced to the dielectric layer existing between the adjacent internal electrodes 21 and 22. Therefore, a product which does not have an internal structural defect or a defect which may possibly shorten a life duration in a period of service is not damaged in screening. On the other hand, as to a product having a defect between the internal electrodes 21 and 22, the defect can be elicited, and this product can be screened as a defective based on a reduction in IR due to this elicitation of the defect.

If the direct-current voltage V1 (V/μm) which is applied at the first step is less than 20 (V/μm), sufficient screening is not carried out, and hence a crack or a defective is generated in a thermal evaluation or a reliability evaluation. If the direct-current voltage V1 (V/μm) which is applied at the first step exceeds 40 (V/μm), this voltage becomes an excessive voltage, a damage such as an internal crack remains in a product, and a crack or a defective is generated in the thermal evaluation and the reliability evaluation.

Furthermore, since the direct-current voltage V2 (V) taking the rated voltage into consideration is applied at the second step after the first step, the reliability evaluation can be made at this second step. Therefore, a product which may possibly shorten its life duration during a period of service can be selectively eliminated in advance, and the reliability can be guaranteed.

It is preferable for a thickness of the dielectric layer between the adjacent internal electrodes 21 and 22 (interlayer thickness) to be not more than 10 μm. A laminated ceramic capacitor C with a small size and a large capacity can be obtained by making the dielectric layer thickness per layer very small in this manner.

The second step must be executed after the first step. If the second step is carried out before the first step, screening becomes insufficient, and a crack or a defective is produced in the thermal evaluation and the reliability evaluation.

The screening method according to the present invention can be applied to the laminated ceramic capacitor C formed of a dielectric material demonstrating one of B characteristics, F characteristics and X7R characteristics. The B characteristics means a case in which an electrostatic capacity change rate (ΔC/C) when no voltage is applied falls within a range of ±10% in a temperature range of (−25° C.) to (+85° C.). The F characteristics means a case in which the electrostatic capacity change rate (ΔC/C) when no voltage is applied falls within a range of (+30%) to (−80%) in the temperature range of (−25° C.) to (+85° C.). The X7R characteristics means a case in which the electrostatic capacity change rate (ΔC/C) when no voltage is applied falls within a range of ±15% in the temperature range of (−55° C.) to (+125° C.).

Effects of the screening method according to the present invention will now be described taking experimental data as an example.

1. Evaluation Target Product
(1) Group 1
Product shape: length L×width W (mm)=5.7×5.0 (mm)
Temperature characteristics: B characteristics
Number of layers: 100 layers
Interlayer thickness (after baking): 10 μm
Rated voltage: 50 V
A product belonging to the group 1 is referred to as C5750.
(2) Group 2
Product shape: length L×width W (mm)=4.5×3.2 (mm)
Temperature characteristics: F characteristics
Number of layers: 100 layers
Interlayer thickness (after baking): 14 μm
Rated voltage: 50 V
A product belonging to the group 2 is referred to as C4532.

2. Test Conditions and Evaluation (1) Screening

An evaluation target product was set on a hot plate, and a temperature was gradually increased. After a surface temperature of the evaluation target product was stabled at a set temperature, a direct-current voltage was applied, an IR was measured, and screening was executed. In this screening, an application time of the direct-current voltage V1 at the first step was set within a range of 10 msec to 1.0 sec, and an application time of the direct-current voltage V2 at the second step was set within a range of 10 msec 1.0 sec.

(2) Thermal Evaluation

In order to confirm a damage due to voltage application, the thermal evaluation was made with respect to 60 evaluation target products which were judged as good products. Its concrete content is as follows.

First, an evaluation target product which was subjected to screening processing was fixed on an evaluation glass epoxy substrate by using an adhesive, and then flow soldering was carried out by using a jet soldering apparatus. A solder temperature was set to 320° C. An external appearance of the evaluation target product subjected to soldering was observed, and the number (quantity) of positions where cracks were produced was confirmed.

(3) Reliability Evaluation 300 evaluation target products which were judged as good products in the screening and the thermal evaluation were soldered on a reliability evaluation glass epoxy substrate by reflow soldering. As an evaluation condition, these products were subjected to a high-temperature load test (125° C., a voltage which is twofold of W−V), and a defective occurrence situation up to 250 hours was confirmed.

Table 1 shows the test condition and the evaluation of each evaluation target product. In this table, V1 (V/μm) denotes a direct-current voltage applied at the first step. The evaluation target product C5750 has a layer thickness of 10 μm per layer, and hence the tenfold direct-current voltage V1 (V) is applied. The evaluation target product C4532 has a layer thickness of 14 μm per layer, and hence the 14-fold direct-current voltage V1 (V) is applied.

V2 designates a direct-current voltage applied at the second step. Since each of the evaluation target products C5750 and C4532 has the rated voltage of 50 V, the direct-current voltage applied at the second step is fivefold of the rated voltage in the embodiment 5, and it is threefold of the rated voltage in other embodiments and comparative examples. That is, at the second step, the direct-current voltage V2 which is approximately threefold to fivefold of the rated voltage is applied.

TABLE 1

| Target product | Case | Environment temperature (° C.) | V1 (V/μ) | V2 (V) | Thermal Evaluation | Reliability evaluation | Judgment |
|---|---|---|---|---|---|---|---|
| C5750 | Comparative example 1 | 25 | 30 | 150 | 27/60 | 3/300 | NG |
| | Embodiment 1 | 130 | 30 | 150 | 0/60 | 0/300 | OK |
| | Embodiment 2 | 130 | 20 | 150 | 0/60 | 0/300 | OK |
| | Embodiment 3 | 130 | 40 | 150 | 0/60 | 0/300 | OK |
| | Comparative example 2 | 130 | 15 | 150 | 0/60 | 4/300 | NG |
| | Comparative example 3 | 130 | 45 | 150 | 47/60 | 30/300 | NG |
| | Comparative example 4 | 130 | 30 | — | 0/60 | 7/300 | NG |
| | Embodiment 4 | 170 | 30 | 150 | 0/60 | 0/300 | OK |
| | Embodiment 5 | 130 | 30 | 250 | 0/60 | 0/300 | OK |
| C4532 | Embodiment 6 | 130 | 30 | 150 | 0/60 | 0/300 | OK |

Referring to Table 1, in the comparative example 1 in which the temperature condition according to the present invention is not satisfied at an environmental temperature 25° C., occurrence of cracks was confirmed in 27 products out of 60 products in the thermal evaluation, and defectives were generated in three products out of 300 products in the reliability evaluation. It can be surmised that these cracks and defectives are produced since the electrostriction became large in application of the direct-current voltage and cracks were generated in the dielectric layers.

At the first step, in the comparative example 2 in which the direct-current voltage V1 (V/μm) of 15 (V/μm) which is out of the range according to the present invention was applied, defectives were generated in four products out of 300 products in the reliability evaluation. It can be surmised that these defectives were generated because sufficient screening is not carried out due to the low direct-current voltage V1 (V/μm) applied at the first step.

At the first step, in the comparative example 3 in which the direct-current voltage V1 (V/μm) of 45 (V/μm) which is out of the range according to the present invention was applied, occurrence of cracks was confirmed in 47 products out of 60 products in the thermal evaluation, and defectives were produced in 30 products out of 300 products. It can be surmised that these cracks and defective were produced because damages such as internal cracks remained in the products owing to a too high value of the direct-current voltage V1 (V/μm) applied at the first step.

Although the direct-current voltage V1 (V/μm) of 30 (V/μm) which falls within the range according to the present invention was applied at the first step, defectives were generated in seven products out of 300 products in the reliability evaluation in the comparative example 4 which does not have the second step. This result shows that the second step is required in order to assure the reliability.

On the contrary, occurrence of cracks and defectives was not confirmed in the thermal evaluation and the reliability evaluation in all of the embodiments 1 to 6 according to the present invention.

The second step must be executed after the first step. If the second step is carried out before the first step, cracks or defectives are generated in the thermal evaluation and the reliability evaluation.

Table 2 shows a case in which the direct-current voltage V2 (V/μm) of 30 (V/μm) is applied at the second step after application of the direct-current voltage V1 of 150 (V) at the first step, i.e., the process order of the first step and the second step is reversed.

TABLE 2

| Target product | Case | Environment temperature (° C.) | V1 (V) | V2 (V/μm) | Thermal evaluation | Reliability evaluation | Judgment |
|---|---|---|---|---|---|---|---|
| C5750 | Comparative example 5 | 30 | 150 | 30 | 0/60 | 5/300 | NG |

As shown in Table 2, when the order of the second step at which the direct-current voltage taking the rated voltage into consideration should be applied and the first step at which the direct-current voltage of 20 to 40 (V/μm) should be applied is reversed, defectives are generated in five products out of 300 products. It can be surmised that screening is insufficient.

Although the above has described the present invention with reference to the preferred embodiments, the present invention is not restricted thereto, and it is self-apparent that persons skilled in the art can hit upon various modifications based on basic technical concepts and teachings of the present invention.

What is claimed is:

1. A screening method for laminated ceramic capacitors, wherein the laminated ceramic capacitor has a plurality of internal electrodes embedded in a dielectric base substance in a stratified manner, the internal electrodes being caused to conduct to a pair of terminal electrodes provided on an outer surface of the dielectric base substance, the terminal electrode having an outermost layer containing Sn as a main component;

the laminated ceramic capacitor is set in a temperature environment which is not less than 125° C. and not more than 180° C.;

a step of applying a direct-current voltage between the terminal electrodes in order to measure a direct-current insulation resistance is included;

the step of applying the direct-current voltage includes a first step and a second step;

a direct-current voltage V1 (V) is applied such that a ratio of the direct-current voltage V1 (V) to a distance between which the direct-current voltage is applied is in the range of 20 to 40 (V/μm) at the first step; and a direct-current voltage V2 (V) is applied at the second step after termination of the first step, wherein the direct-current voltage V2 (V) is no less than threefold and no more than fivefold of a rated voltage of the ceramic capacitor.

2. The screening method according to claim 1, wherein an interlayer thickness is not more than 10 μm.

3. The screening method according to claim 1, wherein the dielectric material is formed of a dielectric material other than relaxa-based material, which demonstrates ferroelectric characteristics at an ordinary temperature.

4. The screening method according to claim 1, wherein a voltage application time at the first step is preferably 10 msec to 1.0 sec.

5. The screening method according to claim 1, wherein a voltage application time at the second step is preferably 10 msec to 1.0 sec.

* * * * *